(12) United States Patent
Erstad et al.

(10) Patent No.: US 7,579,879 B2
(45) Date of Patent: Aug. 25, 2009

(54) VOTING SCHEME FOR ANALOG SIGNALS

(75) Inventors: David O. Erstad, Minnetonka, MN (US); Bruce W. Ohme, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 355 days.

(21) Appl. No.: 11/262,081

(22) Filed: Oct. 27, 2005

(65) Prior Publication Data

US 2007/0109012 A1 May 17, 2007

(51) Int. Cl.
*G06F 1/08* (2006.01)
(52) U.S. Cl. .......................... 327/99; 327/407
(58) Field of Classification Search ................ 327/99, 327/407
See application file for complete search history.

(56) References Cited

U.S. PATENT DOCUMENTS

| | | | | |
|---|---|---|---|---|
| 3,412,261 A | * | 11/1968 | Hickin et al. ............... 326/11 |
| 3,420,993 A | * | 1/1969 | Chamberlain et al. ....... 708/800 |
| 3,530,381 A | * | 9/1970 | Klein et al. ................ 324/71.1 |
| 3,544,778 A | * | 12/1970 | Masters, Jr. ................ 708/805 |
| 3,667,057 A | * | 5/1972 | Pfersch et al. .............. 327/360 |
| 3,689,802 A | * | 9/1972 | Waldmann et al. ........... 361/86 |
| 3,863,056 A | * | 1/1975 | Klein ....................... 324/140 R |
| 3,979,720 A | * | 9/1976 | Laas et al. .................. 708/805 |
| 4,143,353 A | * | 3/1979 | Schaible .................... 714/819 |
| 4,264,955 A | * | 4/1981 | Goodwin .................... 700/282 |
| 4,707,621 A | | 11/1987 | Arita |
| 5,220,208 A | * | 6/1993 | Schenck ..................... 326/27 |
| 5,838,166 A | * | 11/1998 | Nakamura .................. 326/36 |
| 6,040,718 A | | 3/2000 | Henry |
| 6,525,590 B2 | | 2/2003 | Swonger ..................... 327/403 |
| 6,563,347 B2 | | 5/2003 | Doyle et al. ................. 327/65 |
| 6,798,367 B2 | * | 9/2004 | Nakagawa et al. ........... 341/144 |
| 6,838,899 B2 | | 1/2005 | Plants ........................ 326/9 |
| 6,906,388 B2 | * | 6/2005 | Fulkerson ................... 257/369 |
| 2002/0060585 A1 | | 5/2002 | Doyle |
| 2002/0101269 A1 | * | 8/2002 | Swonger ..................... 327/199 |

FOREIGN PATENT DOCUMENTS

EP 0625755 A 11/1994

OTHER PUBLICATIONS

European Search Report issued on Oct. 8, 2008 in corresponding EPO application 06122955.5.

* cited by examiner

*Primary Examiner*—Kenneth B. Wells
(74) *Attorney, Agent, or Firm*—McDonnell Boehnen Hulbert & Berghoff LLP

(57) ABSTRACT

A voting scheme for analog signals is described. An analog block is replicated to provide three analog blocks that are designed to have substantially the same analog output based on receiving substantially the same input. Voting is used to compare the analog outputs from the three analog blocks. In one example, the analog output from one of the three analog blocks having a middle value between the values of the other two analog outputs is provided as an output of the voter circuit. In another example, if the original analog block provides the analog output having the middle value, the output of the original analog block is provided as an output of the voter circuit. Otherwise, an output of another analog block is provided as an output of the voter circuit. In another example, the analog voter circuit determines which of the three analog outputs have been impacted by a transient event based on a non-zero output of transconductor circuits. These analog voting schemes may be incorporated into any circuit design in which an analog signal may be susceptible to SEE.

13 Claims, 3 Drawing Sheets

VOTING SCHEME FOR ANALOG SIGNALS

FIELD

The present invention relates generally to analog circuit design, and more particularly, relates to hardening analog circuits against single event effects.

BACKGROUND

Single Event Effects (SEE) are disturbances in an active semiconductor device caused by a single energetic particle. One type of SEE is a single event upset (SEU). SEU is a radiation-induced error in a semiconductor device caused when charged particles lose energy by ionizing the medium through which they pass, leaving behind a wake of electron-hole pairs. The electron-hole pairs form a parasitic conduction path, which can cause a false transition on a node. The false transition, or glitch, can propagate through the semiconductor device and may ultimately result in the disturbance of a node containing state information, such as an output of a latch, register, or gate. One type of SEU is a single event transient (SET). SETs occur when a particle strikes a sensitive node within a circuit.

Typically, SEUs are caused by ionizing radiation components in the atmosphere, such as neutrons, protons, and heavy ions. The ionizing radiation components are abundant in space and also at commercial flight altitudes. Additionally, SEUs can be caused by alpha particles from the decay of trace concentrations of uranium and thorium present in some integrated circuit packaging. As another example, SEUs may be caused by detonating nuclear weapons. When a nuclear weapon is detonated, intense fluxes of gamma rays, x-rays, and other high energy particles are created.

Some semiconductor devices are designed to operate in conditions that expose the devices to energetic particles. These devices are typically modified to be hardened against SEE. Many hardened circuit designs are directed towards hardening digital circuits. For example, triple mode redundancy voting is one known method for hardening digital circuits. Some analog circuits may also operate in conditions that expose the circuit to energetic particles. These analog circuits also need to be hardened against SEE.

Therefore, it would be beneficial to harden an analog signal against SEE to prevent errors from propagating through analog circuits.

SUMMARY

A system and method for hardening an analog signal are described. The analog signal may be hardened against SEE by providing an analog voting scheme. The use of an analog voting scheme may be applied to any type of analog signal.

In one example, an analog voter circuit includes a first analog block, a second analog block, and a third analog block. The analog blocks are designed to provide substantially similar analog outputs when receiving substantially similar inputs. The analog voter circuit includes a plurality of comparators that compare the analog outputs of the first, second, and third analog blocks.

The analog voter circuit also includes switches that selectively provide an analog output of the analog voter circuit. The output of the voter circuit is the output of the analog block having the middle value of the three analog outputs from the first, second, and third analog blocks. Logic circuitry controls the switches. The logic circuitry includes a plurality of AND gates (or other hardware and/or software that functions as an AND gate) that identify which one of the first, second, and third analog blocks has the analog output having the middle value. The logic circuitry further includes OR gates (or other hardware and/or software that functions as an OR gate) that control a state of the switches based on outputs from the AND gates.

As described above, the analog voter circuit output is the output of the analog block having the middle value of the three analog blocks. The highest and lowest value outputs of the analog blocks are not provided as an output of the analog voter circuit. As a result, a high or low transient signal caused by SEE is prevented from being provided as an output of the analog voter circuit.

In another example, the analog voter circuit includes a first analog block, a second analog block, and a third analog block. The analog blocks are designed to provide substantially similar analog outputs when receiving substantially similar inputs. The analog voter circuit includes a first comparator that compares the analog output of the first analog block with the analog output of the second analog block and a second comparator that compares the analog output of the first analog block with the analog output of the third analog block.

The analog voter circuit also includes switches that select as an output of the analog voter circuit the analog output of the first analog block if the first analog block output has a middle value that is between values of the analog outputs of the second and third analog blocks. Logic circuitry controls the switches. The logic circuitry includes an exclusive OR gate (or other hardware and/or software that functions as an exclusive OR gate) that detects whether the analog output of the first analog block has a middle value between the values of the analog outputs of the second and third analog blocks. The logic circuitry further includes an inverter that controls a state of one of the switches based on an output from the exclusive OR gate.

If the analog output from the first analog block has a value that is in the middle of the three analog block output values, the output of the first analog block is provided as the output of the analog voter circuit. Otherwise, the analog output of the second analog block or the third analog block is provided as an output of the analog voter circuit. As a result, the analog voter circuit only provides the output of the first analog block if the output is valid and not impacted by a transient event.

In another example, an analog voter circuit includes a first analog block, a second analog block, and a third analog block. The analog blocks are designed to provide substantially similar analog outputs when receiving substantially similar inputs. The first analog block provides a first analog output, the second analog block provides a second analog output, and the third analog block provides a third analog output.

The analog voter circuit also includes a first transconductor circuit having a first transistor pair and a second transistor pair. The first transistor pair includes a first transistor connected in parallel with a second transistor and the second transistor pair includes a third transistor connected in parallel with a fourth transistor. A first load is connected between the first and second transistor pairs. The first analog output is connected to a gate of the first transistor, the second analog output is connected to a gate of the second and third transistors, and the third analog output is connected to a gate of the fourth transistor.

The analog voter circuit also includes a second transconductor circuit having a third transistor pair and a fourth transistor pair. The third transistor pair includes a fifth transistor connected in parallel with a sixth transistor. The fourth transistor pair includes a seventh transistor connected in parallel with an eighth transistor. A second load is connected between the third and fourth transistor pairs. The second analog output is connected to a gate of the fifth transistor, the first analog output is connected to a gate of the sixth and seventh transistors, and the third analog output is connected to a gate of the eighth transistor.

The first transconductor circuit further includes a first current source connected between power and a first side of the first load, a second current source connected between power and a second side of the first load, and a third current source connected between ground and the first and second transistor pairs. The second transconductor circuit further includes a fourth current source connected between power and a first side of the second load, a fifth current source connected between power and a second side of the second load, and a third current source connected between ground and the third and fourth transistor pairs.

The first and second transconductor circuits function as voltage to current converters. An output of the first transconductor circuit is current flowing through the first load and an output of the second transconductor circuit is current flowing through the second load. The outputs of the first and second transconductor circuits change from a value of substantially zero to a non-zero value if one of the first, second, and third analog blocks is impacted by a transient event. By detecting non-zero outputs, the analog block impacted by the transient event can be identified and an output from an analog block unaffected by the transient event can be selectively used.

A method for hardening analog signals includes replicating an analog block so as to provide at least three analog blocks that are designed to provide substantially similar analog outputs when receiving substantially similar inputs. The method also includes comparing the analog outputs of the at least three analog blocks, and selecting an analog output from one of the at least three analog blocks that is not impacted by a transient event.

In one example, comparing analog outputs of the at least three analog blocks includes using comparators to compare the analog outputs. In another example, comparing analog outputs of the at least three analog blocks includes using transconductor circuits to compare the analog outputs.

In one example, selecting an analog output that is not impacted by a transient event includes providing an analog output of one of the first, second, and third analog blocks having a middle value that is between the values of the analog outputs of the other two analog blocks. In another example, selecting an analog output that is not impacted by a transient event includes providing as an analog output of the analog voter circuit the analog output of the first analog block if the first analog block output has a middle value between values of the analog outputs of the second and third analog blocks. In another example, selecting an analog output that is not impacted by a transient event includes detecting a non-zero value of an output from a first and second transconductor circuit.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

An analog signal may be hardened against the effects of SEE by providing an analog voting scheme. The use of an analog voting scheme may be applied to any type of analog signal. While many analog voter implementations are possible, three analog voter circuits are described. These analog voter circuits may be incorporated into any circuit design in which an analog signal may be susceptible to SEE.

Figure 1:
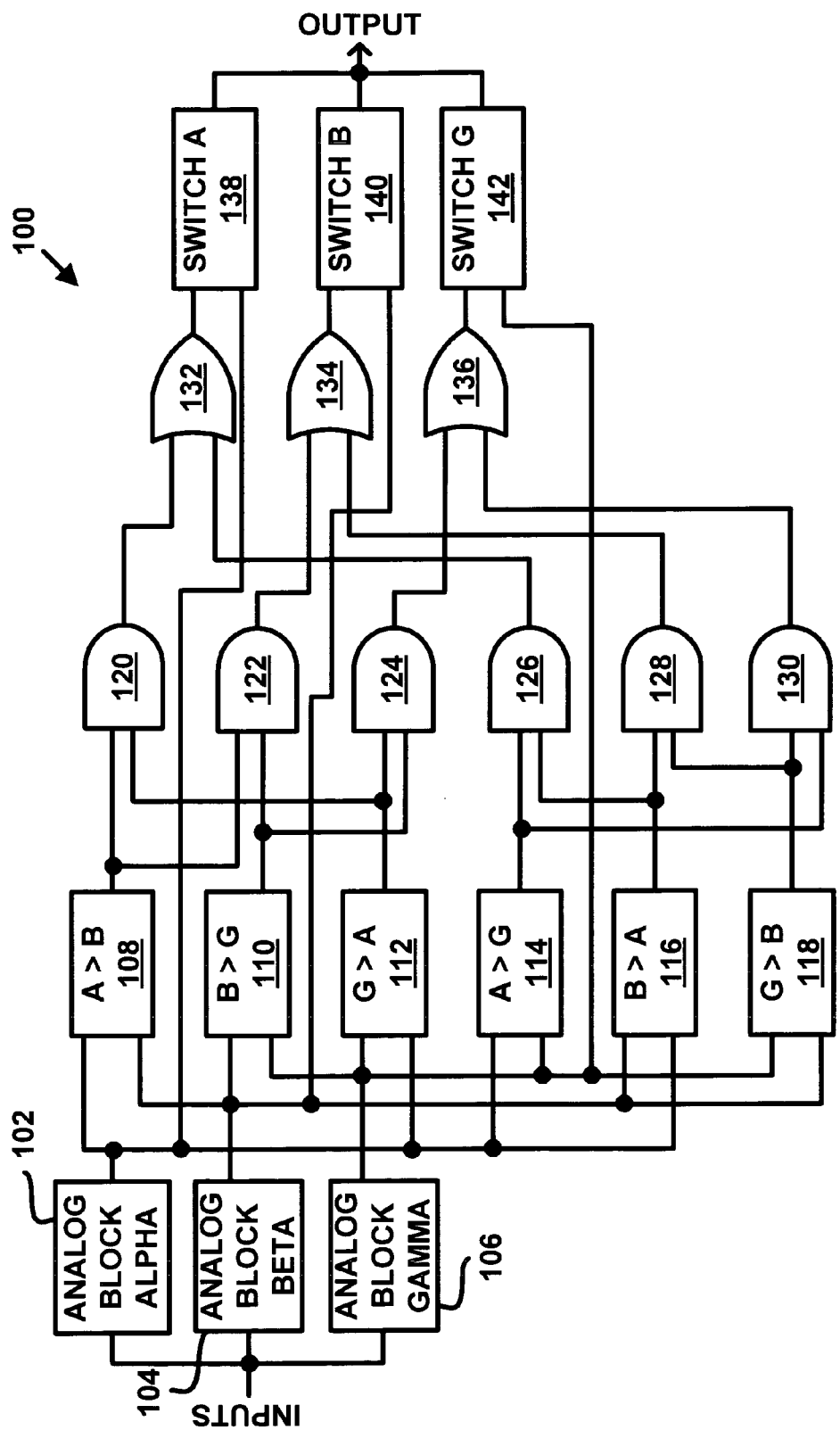
FIG. 1 is a circuit diagram of an analog voter, according to an example.

FIG. 1 is a circuit diagram of an analog voter 100. The analog voter 100 includes three analog blocks 102-106. The analog blocks 102-106 have been identified in FIG. 1 as alpha (A), beta (B), and gamma (G). In an unhardened circuit design, a single analog block is used. The other two analog blocks are added to the original analog block for voting purposes. More than three analog blocks may also be used in the analog voter 100.

The analog blocks 102-106 may include any device or circuit that provides an analog output. The analog output may be a voltage or a current output. In the case of a current output, the current signal may be converted to a voltage input to the voter. For example, the analog blocks 102-106 may include a digital-to-analog (D/A) converter and/or a filter. Each of the analog blocks 102-106 may contain the same circuitry. Alternatively, the analog blocks 102-106 may contain different circuitry designed to provide the same output based on receiving the same input.

The analog blocks 102-106 may have one or more inputs. The input to the analog blocks 102-106 may be analog or digital based on the circuitry included in the analog blocks 102-106. For example, if the analog blocks 102-106 include an eight-bit D/A converter, the analog blocks 102-106 may receive eight digital inputs.

The analog voter 100 also includes six comparators 108-118. The comparators 108-118 are designed to compare a first input with a second input. If the first input has a magnitude greater than a magnitude of the second input, the comparators 108-118 provide a logic-1 output. If the first input has a magnitude less than a magnitude of the second input, the comparators 108-118 provide a logic-0 output. Additional comparators may be used in the analog voter 100 if more than three analog blocks are used.

An analog output from each of the analog blocks 102-106 is connected to four of the six comparators 108-118. Ideally, the frequency response of the analog blocks 102-106 is compatible with the comparators 108-118. For example, the analog blocks 102-106 may have a low frequency response relative to the response time of the comparators 108-118. The outputs of the alpha and beta blocks 102, 104 are connected to inputs of the comparators 108, 116. The outputs of the beta and gamma blocks 104, 106 are connected to inputs of the comparators 110, 118. The outputs of the alpha and gamma blocks 102, 106 are connected to inputs of the comparators 112, 114.

The comparator 108 provides a logic-1 output if the input signal from the alpha block 102 has a magnitude greater than the input signal from the beta block 104. The comparator 110 provides a logic-1 output if the input signal from the beta block 104 has a magnitude greater than the input signal from the gamma block 106. The comparator 112 provides a logic-1 output if the input signal from the gamma block 106 has a magnitude greater than the input signal from the alpha block 102. The comparator 114 provides a logic-1 output if the input signal from the alpha block 102 has a magnitude greater than the input signal from the gamma block 106. The comparator 116 provides a logic-1 output if the input signal from the beta block 104 has a magnitude greater than the input signal from the alpha block 102. The comparator 118 provides a logic-1 output if the input signal from the gamma block 106 has a magnitude greater than the input signal from the beta block 104. Otherwise, the comparators 108-118 provide a logic-0 output.

The analog voter 100 also includes six AND gates 120-130. The AND gates 120-130 may be replaced by any combination of hardware and/or software that functions similarly to an AND gate. More than six AND gates may be used in the analog voter 100 if more than three analog blocks are used. The AND gates 120-130 include two inputs, each of which is connected to an output of one of the comparators 108-118. The output of the comparator 108 is connected to an input of the AND gates 120, 122. The output of the comparator 110 is connected to an input of the AND gates 122, 124. The output of the comparator 112 is connected to an input of the AND gates 120, 124. The output of the comparator 114 is connected to an input of the AND gates 126, 130. The output of the comparator 116 is connected to an input of the AND gates 126, 128. The output of the comparator 118 is connected to an input of the AND gates 128, 130.

Each of the AND gates 120-130 provide a single output. The AND gate 120 provides a first VALID A output signal. The AND gate 120 provides a logic-1 output, indicating that the analog output of the alpha block 102 is valid, if the output of the comparator 108 and the output of the comparator 112 provide a logic-1 output (i.e., G>A>B). Otherwise, the AND gate 120 provides a logic-0 output, indicating that the analog output of the alpha block 102 is not valid. The AND gate 122 provides a first VALID B output signal. The AND gate 122 provides a logic-1 output, indicating that the analog output of the beta block 104 is valid, if the output of the comparator 108 and the output of the comparator 110 provide a logic-1 output (i.e., A>B>G). Otherwise, the AND gate 122 provides a logic-0 output, indicating that the analog output of the beta block 104 is not valid.

The AND gate 124 provides a first VALID G output signal. The AND gate 124 provides a logic-1 output, indicating that the analog output of the gamma block 106 is valid, if the output of the comparator 110 and the output of the comparator 112 provide a logic-1 output (i.e., B>G>A). Otherwise, the AND gate 124 provides a logic-0 output, indicating that the analog output of the gamma block 106 is not valid.

The AND gate 126 provides a second VALID A output signal. The AND gate 126 provides a logic-1 output, indicating that the analog output of the alpha block 102 is valid, if the output of the comparator 114 and the output of the comparator 116 provide a logic-1 output (i.e., B>A>G). Otherwise, the AND gate 126 provides a logic-0 output, indicating that the analog output of the alpha block 102 is not valid.

The AND gate 128 provides a second VALID B output signal. The AND gate 128 provides a logic-1 output, indicating that the analog output of the beta block 104 is valid, if the output of the comparator 116 and the output of the comparator 118 provide a logic-1 output (i.e., G>B>A). Otherwise, the AND gate 128 provides a logic-0 output, indicating that the analog output of the beta block 104 is not valid.

The AND gate 130 provides a second VALID G output signal. The AND gate 130 provides a logic-1 output, indicating that the analog output of the gamma block 106 is valid, if the output of the comparator 114 and the output of the comparator 118 provide a logic-1 output (i.e., A>G>B). Otherwise, the AND gate 130 provides a logic-0 output, indicating that the analog output of the gamma block 106 is not valid.

The analog voter 100 also includes three OR gates 132-136. The OR gates 132-136 may be replaced by any combination of hardware and/or software that functions similarly to an OR gate. Additional OR gates may be used in the analog voter 100 if more than three analog blocks are used. The OR gates 132-136 include two inputs, each of which are connected to an output of the AND gates 120-130. The OR gate 132 receives the first and second VALID A signals from the AND gates 120, 126. The OR gate 134 receives the first and second VALID B signals from the AND gates 122, 128. The OR gate 136 receives the first and second VALID G signals from the AND gates 124, 130.

The OR gates 132-136 provide a single output. The OR gate 132 provides a logic-1 output if either VALID A signal is at a logic-1 level. The OR gate 134 provides a logic-1 output if either VALID B signal is at a logic-1 level. The OR gate 136 provides a logic-1 output if either VALID G signal is at a logic-1 level. Otherwise, the OR gates 132-136 provide a logic-0 output.

The analog voter 100 also includes three switches 138-142. Additional switches may be used in the analog voter 100 if more than three analog blocks are used. Each of the switches includes two inputs. A first input of each of the switches 138-142 (an enable input) is connected to an output of the OR gates 132-136 and a second input of each of the switches (a data input) is connected to an output of the analog blocks 102-106. The enable input controls whether the switches 138-142 are in an open or closed state.

The output of the OR gate 132 controls the state of the switch 138. The switch 138 is closed when the output of the OR gate 132 is at a logic-1 level. The switch 138 is opened when the output of the OR gate 132 is at a logic-0 level. When the switch 138 is closed, the output of the alpha block 102 is transferred to an output of the switch 138. When the switch 138 is open, the output of the alpha block 102 is prevented from being transferred to the output of the switch 138.

The output of the OR gate 134 controls the state of the switch 140. The switch 140 is closed when the output of the OR gate 134 is at a logic-1 level. The switch 140 is opened when the output of the OR gate 134 is at a logic-0 level. When the switch 140 is closed, the output of the beta block 104 is transferred to an output of the switch 140. When the switch 140 is open, the output of the beta block 104 is prevented from being transferred to the output of the switch 140.

The output of the OR gate 136 controls the state of the switch 142. The switch 142 is closed when the output of the OR gate 136 is at a logic-1 level. The switch 142 is opened when the output of the OR gate 136 is at a logic-0 level. When the switch 142 is closed, the output of the gamma block 106 is transferred to an output of the switch 142. When the switch 142 is open, the output of the gamma block 106 is prevented from being transferred to the output of the switch 142.

The outputs of the switches 138-142 are connected to provide an output of the analog voter 100. Only one of the switches 138-142 is enabled at a particular instant in time. As a result, only one of the outputs from the analog blocks 102-106 is provided as an output to the analog voter 100. The output of the analog voter 100 is the analog signal from the analog blocks 102-106 having a value that is between the values of the other two analog signals. Thus, the analog voter 100 provides the medial signal as an output, which prevents either a high or low transient signal caused by SEE to be provided as an output of the analog voter.

Figure 2:
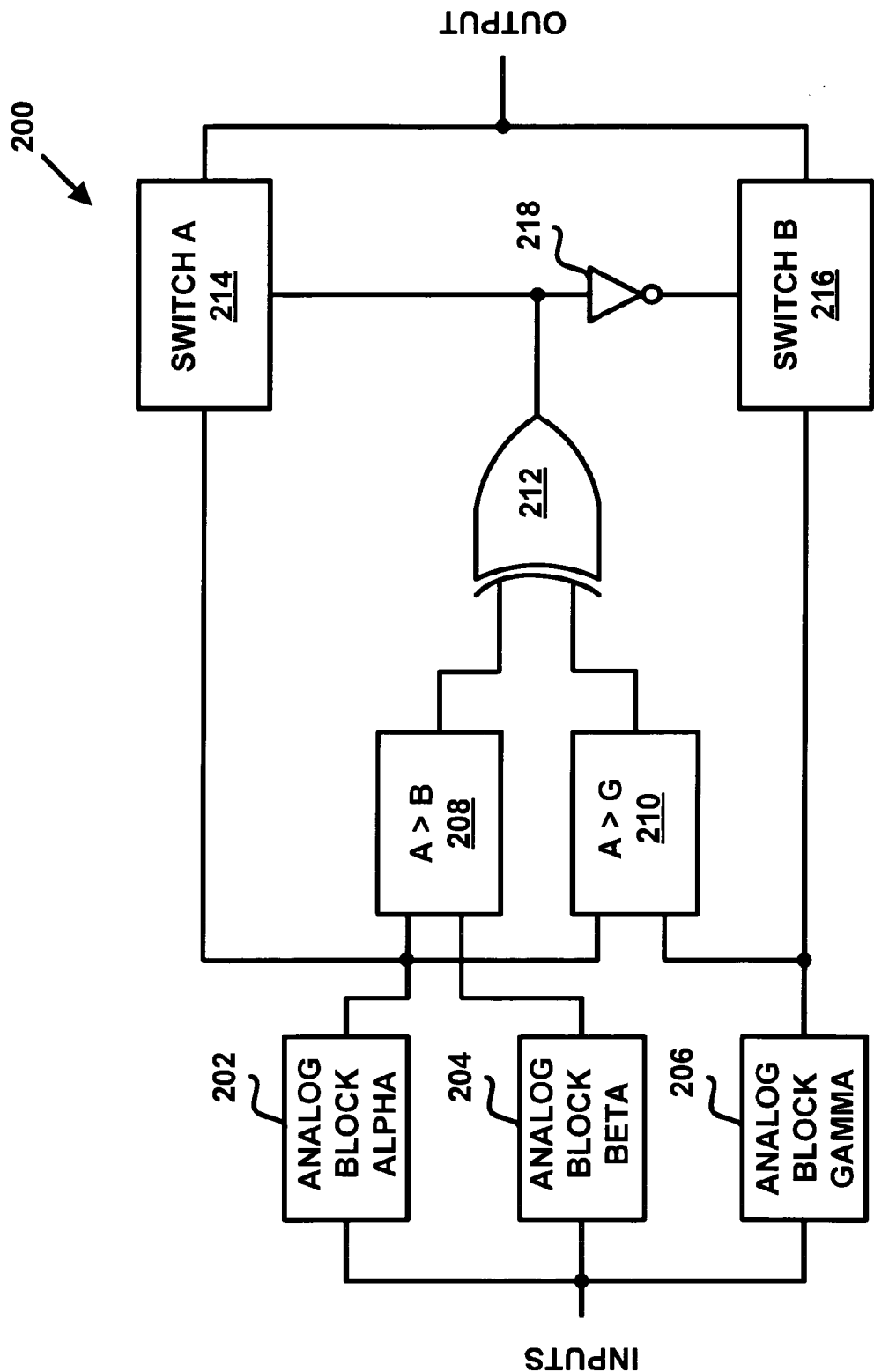
FIG. 2 is a circuit diagram of an analog voter, according to another example.

FIG. 2 is a circuit diagram of an analog voter 200. The analog voter 200 includes three analog blocks 202-206. The analog blocks 202-206 are substantially the same as the analog blocks 102-106 depicted in FIG. 1. The analog blocks 202-206 have been identified in FIG. 2 as alpha (A), beta (B), and gamma (G). In an unhardened circuit design, a single analog block is used (e.g., alpha block 202). The other two analog blocks are added to the original analog block for voting purposes (e.g., beta block 204 and gamma block 206). More than three analog blocks may also be used in the analog voter 200.

The analog blocks 202-206 may include any device or circuit that provides an analog output. The analog output may be a voltage or a current output. In the case of a current output, the current signal may be converted to a voltage input to the voter. For example, the analog blocks 202-206 may include a digital-to-analog (D/A) converter and/or a filter. Each of the analog blocks 202-206 may contain the same circuitry. Alternatively, the analog blocks 202-206 may contain different circuitry designed to provide the same output based on receiving the same input.

The analog blocks 202-206 may have one or more inputs. The input to the analog blocks 202-206 may be analog or digital based on the circuitry included in the analog blocks 202-206. For example, if the analog blocks 202-206 include an eight-bit D/A converter, the analog blocks 202-206 may receive eight digital inputs.

The analog voter 200 also includes two comparators 208, 210. The comparators 208, 210 are designed to compare a first input with a second input. If the first input has a magnitude greater than a magnitude of the second input, the comparators 208, 210 provide a logic-1 output. If the first input has a magnitude less than a magnitude of the second input, the comparators 208, 210 provide a logic-0 output. Additional comparators may be used in the analog voter 200 if more than three analog blocks are used.

The outputs of the alpha and beta blocks 202, 204 are connected to inputs of the comparator 208. The outputs of the alpha and gamma blocks 102, 106 are connected to inputs of the comparator 210. Ideally, the frequency response of the analog blocks 202-206 is compatible with the comparators 208, 210. For example, the analog blocks 202-206 may have a low frequency response relative to the response time of the comparators 208, 210.

The comparator 208 provides a logic-1 output if the input signal from the alpha block 202 has a magnitude greater than the input signal from the beta block 204. The comparator 110 provides a logic-1 output if the input signal from the alpha block 202 has a magnitude greater than the input signal from the gamma block 206. Otherwise, the comparators 108, 110 provide a logic-0 output.

The analog voter 200 also includes an exclusive OR (XOR) gate 212. The XOR gate 212 may be replaced by any combination of hardware and/or software that functions similarly to an XOR gate. Additional logic gates may be used in the analog voter 200 if more than three analog blocks are used. The XOR gate 212 has two inputs. The output of the comparator 208 is connected to one of the inputs to the XOR gate 212, while the output of the comparator 210 is connected to the other input to the XOR gate 212.

The XOR gate 212 has a single output. The output of the XOR gate 212 is at a logic-1 level when only one of the comparators 208, 210 provides a logic-1 output. Thus, the output of the XOR gate 212 is at a logic-1 level when the output of the alpha block 202 has a magnitude that is between the magnitudes of the outputs from the beta block 204 and the gamma block 206 (i.e., B>A>G or G>A>B). Otherwise, the XOR gate 212 provides a logic-0 output.

The analog voter 200 also includes two switches 214, 216 and an inverter 218. Additional switches and inverters may be used in the analog voter 200 if more than three analog blocks are used. Each of the switches 214, 216 includes two inputs. A first input of each of the switches 214, 216 is an enable input and a second input of each of the switches 214, 216 is a data input. The enable input controls whether the switches 214, 216 are in an open or closed state.

The output of the XOR gate 212 is connected to the enable input of the switch 214. The output of the XOR gate 212 is also connected to an input of the inverter 218. An output of the inverter 218 is connected to the enable input of the switch 216. The output of the alpha block 202 is connected to the data input of the switch 214. Either the output of the beta block 204 or the output of the gamma block 206 is connected to the data input of the switch 216. While FIG. 2 depicts the output of the gamma block 206 connected to the switch 216, the output of the beta block 204 may alternatively be connected to the switch 216 without impacting the operation of the analog voter 200.

The output of the XOR gate 212 controls the state of the switches 214, 216. The switch 214 is closed and the switch 216 is opened when the output of the XOR gate 212 is at a logic-1 level. The switch 214 is opened and the switch 216 is closed when the output of the XOR gate 212 is at a logic-0 level. When the switch 214 is closed, the output of the alpha block 202 is transferred to an output of the switch 214. When the switch 214 is open, the output of the alpha block 202 is prevented from being transferred to the output of the switch 214. When the switch 216 is closed, the output of either the beta block 204 or the gamma block 206 is transferred to an output of the switch 216. For example, in the embodiment shown in FIG. 2, the output of the gamma block 206 is connected to the switch 216 and thus, when the switch 216 is closed, the output of the gamma block 206 is transferred to the output of the switch 216. For an alternative embodiment (not shown) where the beta block 204 is connected to the switch 216, the output of the beta block 204 would be provided to an output of the switch 216 when the switch 216 is closed. When the switch 216 is open, the output of the beta block 204 or gamma block 206 is prevented from being transferred to the output of the switch 216. For example, in the embodiment shown in FIG. 2, the output of the gamma block 206 is connected to the switch 216 and thus, when the switch 216 is open, the output of the gamma block 206 is prevented from being transferred to the output of the switch 216. For an alternative embodiment (not shown) where the beta block 204 is connected to the switch 216, the output of the beta block 204 would be prevented from being transferred to the output of the switch 216 when the switch 216 is open.

The outputs of the switches 214, 216 are connected to provide an output of the analog voter 200. Only one of the switches 214, 216 is enabled at a particular instant in time. If the analog output from the alpha block 202 has a value that is between the values of the analog outputs from the beta block 204 and the gamma block 206, the output of the analog voter 200 is the output of the alpha block 202. Otherwise, the analog output of the beta block 204 or the gamma block 206 is provided as an output of the analog voter 200, depending on which of either beta block 204 or gamma block 206 is connected to the switch 216.

Figure 3:
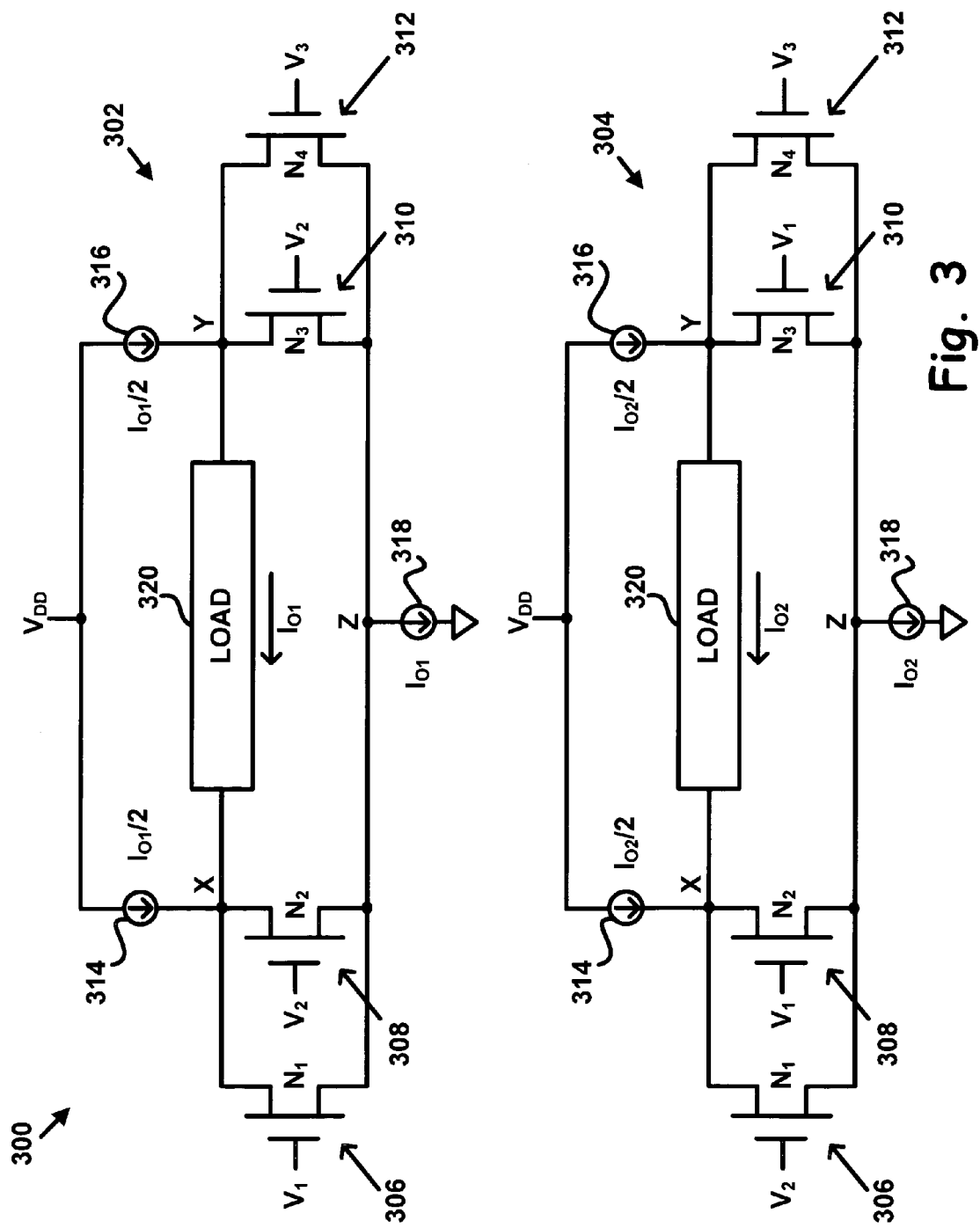
FIG. 3 is a circuit diagram of an analog voter, according to another example.

FIG. 3 is a circuit diagram of an analog voter 300. The analog voter 300 may be used instead of the comparator circuits and logic gates depicted in FIGS. 1 and 2. The analog voter 300 may be used in conjunction with the analog blocks 102-106 depicted in FIG. 1, the analog blocks 202-206 depicted in FIG. 2, or any other analog blocks. Additionally, the analog voter 300 may be used with a switching circuit, such as switches 138-142 depicted in FIG. 1 or switches 214-216 with inverter 218 depicted in FIG. 2. However, as described below, any circuitry designed to detect non-zero outputs of the analog voter 300 may be used instead of or in addition to a switching circuit.

The analog voter 300 includes a first transconductor circuit 302 and a second transconductor circuit 304. The transconductor circuits 302, 304 function as voltage to current converters. The first and second transconductor circuits 302, 304 may be substantially the same. However, analog voltage inputs connected to the first and second transconductor circuits 302, 304 may be different.

The transconductor circuits 302, 304 may be described as dual-differential transconductor circuits. The transconductor circuits 302, 304 include four transistors 306-312, three current sources 314-318, and a load 320. Any transistor type may be used in the transconductor circuits 302, 304. For example, the transistors 306-312 may be CMOS transistors. Moreover, while the transistors 306-312 are depicted in FIG. 3 as n-channel devices, the transistors 306-312 may also be p-channel devices. The current output of the transconductor circuits 302, 304 is the current flowing through the load 320. The load 320 may represent any device or circuitry connected to the transconductor circuits 302, 304, such as a device for measuring the output current of the transconductor circuits 302, 304.

The first and second transistors 306, 308 are connected in parallel between nodes X and Z. The third and fourth transistors 310, 312 are connected in parallel between nodes Y and Z. The load 320 is connected between nodes X and Y. The current source 314 is connected between $V_{DD}$ and Node X. The current source 316 is connected between $V_{DD}$ and Node Y. The current source 318 is connected between Node Z and ground. An amount of current flowing from VDD to each of nodes X and Y is approximately half of the current flowing through the load 320. An amount of current flowing from node Z to ground is approximately the same as the current flowing through the load 320.

In the first transconductor circuit 302, a first analog voltage ($V_1$) is applied to the gate of the first transistor 306, a second analog voltage ($V_2$) is applied to the gates of the second and third transistors 308, 310, and a third analog voltage ($V_3$) is applied to the gates of the fourth transistor 312. In the second transconductor circuit 304, the second analog voltage ($V_2$) is applied to the gate of the first transistor 306, the first analog voltage ($V_1$) is applied to the gates of the second and third transistors 308, 310, and the third analog voltage ($V_3$) is applied to the gates of the fourth transistor 312.

The first analog voltage ($V_1$) may be the output of the alpha block 102, 202 depicted in FIGS. 1 and 2. The second analog voltage ($V_2$) may be the output of the beta block 104, 204 depicted in FIGS. 1 and 2. The third analog voltage ($V_3$) may be the output of the gamma block 106, 206 depicted in FIGS. 1 and 2.

For the first transconductor circuit 302, $I_{O1}/2\ g_m=(V_1-V_3)$. For the second transconductor circuit 304, $I_{O2}/2\ g_m=(V_2-V_3)$. In these equations, $I_{O1}$ is the current output of the first transconductor circuit 302, $I_{O2}$ is the current output of the second transconductor circuit 304, and $g_m$ is the transconductance gain of the transconductor circuits 302, 304. The first, second, and third analog voltages ($V_1$, $V_2$, $V_3$) are expected to be substantially the same. As a result, the output of the first transconductor circuit 302 and the output of the second transconductor circuit 304 should be substantially equal to zero. If one of the three analog voltages has been impacted by a transient event, the output of one or both of the transconductor circuits 302, 304 may be non-zero.

If the first analog voltage changes, the analog voter 300 may detect that $I_{O1}$ is not equal to zero and that $I_{O2}$ is substantially equal to zero. If the second analog voltage changes, the analog voter 300 may detect that $I_{O1}$ is substantially equal to zero and that 102 is not equal to zero. If the third analog voltage changes, the analog voter 300 may detect that both $I_{O1}$ and $I_{O2}$ are not equal to zero. If none of the three analog voltage changes, the analog voter 300 may detect that both $I_{O1}$ and $I_{O2}$ are substantially equal to zero.

The analog voter 300 may include additional circuitry designed to detect non-zero outputs of the transconductor circuits 302, 304. By detecting non-zero outputs, the analog block impacted by the transient event can be identified and an output from an analog block unaffected by the transient event can be selectively used. Voting is based on any means that can detect a non-zero output of the transconductor circuits 302, 304.

While the analog voter 300 is described using transconductor circuits, other circuit designs may be used. Any circuit design that generates an output signal that is proportional to (Signal A+Signal B)−(Signal C+Signal D), where Signal B=Signal C, can be used as an analog voter by replicating the circuit and sensing deviant outputs. For example, instead of a transconductor, a differential voltage output circuit may be used. If the gm-Rout of this device is sufficiently high, the device is basically a comparator. Hysteresis can be applied to this circuit by slightly unbalancing the $I_O/2$ current sources 314, 316 using output feedback.

Three analog voting examples have been described; however, other devices and/or circuit designs may be used for hardening analog signals against SEE. For example, voting may be accomplished using logically equivalent combinations of comparators and digital logic. As another example, comparators that provide a first output if the input signals are equal and a second output if the input signals are not equal may be used. It will also be apparent to one skilled in the art that refinements may be made by design of the comparators, such as tuning comparator deadbands or offsets. The circuit devices used in these examples, such as the comparators, logic gates, and switches, do not need to be hardened against SEE. Moreover, these examples are not limited to any specific process technology.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. An analog voter circuit, comprising in combination:

a first analog block, a second analog block, and a third analog block that are designed to provide substantially similar analog outputs when receiving substantially similar inputs, wherein the first analog block provides a first analog output, wherein the second analog block provides a second analog output, and wherein the third analog block provides a third analog output;

a first transconductor circuit including a first transistor pair and a second transistor pair, wherein the first transistor pair includes a first transistor connected in parallel with a second transistor, wherein the second transistor pair includes a third transistor connected in parallel with a fourth transistor, wherein a first load is connected between the first and second transistor pairs; and wherein the first analog output is connected to a gate of the first transistor, the second analog output is connected to a gate of the second and third transistors, and the third analog output is connected to a gate of the fourth transistor;

a second transconductor circuit including a third transistor pair and a fourth transistor pair, wherein the third transistor pair includes a fifth transistor connected in parallel with a sixth transistor, wherein the fourth transistor pair includes a seventh transistor connected in parallel with an eighth transistor, wherein a second load is connected between the third and fourth transistor pairs; and wherein the second analog output is connected to a gate of the fifth transistor, the first analog output is connected to a gate of the sixth and seventh transistors, and the third analog output is connected to a gate of the eighth transistor; and wherein at least one output of the first transconductor circuit and the second transconductor circuit changes from a value of substantially zero to a non-zero value if one of the first, second, and third analog block outputs is impacted by a transient event.

2. The analog voter circuit of claim 1, wherein the first and second transconductor circuits function as voltage to current converters.

3. The analog voter circuit of claim 1, wherein the output of the first transconductor circuit is current flowing through the first load, wherein the output of the second transconductor circuit is current flowing through the second load.

4. The analog voter circuit of claim 1, wherein the first transconductor circuit farther includes a first current source connected between power and a first side of the first load, a second current source connected between power and a second side of the first load, and a third current source connected between ground and the first and second transistor pairs, and wherein the second transconductor circuit further includes a fourth current source connected between power and a first side of the second load, a fifth current source connected between power and a second side of the second load, and a third current source connected between ground and the third and fourth transistor pairs.

5. An apparatus comprising:
a first comparator comprising four inputs and one output, wherein the output of the first comparator is proportional to the sum of its third and fourth inputs subtracted from the sum of its first and second inputs when its second input is substantially equal to its third input;
a second comparator comprising four inputs and one output, wherein the output of the second comparator is proportional to the sum of its third and fourth inputs subtracted from the sum of its first and second inputs when its second input is substantially equal to its third input;
a first analog circuit comprising a first analog circuit input and a first analog circuit output, wherein the first analog circuit output is coupled to (i) the first input of the first comparator and (ii) the second and third inputs of the second comparator;
a second analog circuit comprising a second analog circuit input and a second analog circuit output, wherein the second analog circuit output is coupled to (i) the second and third inputs of the first comparator and (ii) the first input of the second comparator;
a third analog circuit comprising a third analog circuit input and a third analog circuit output, wherein the third analog circuit output is coupled to (i) the fourth input of the first comparator and (ii) the fourth input of the second comparator;

wherein the first, second, and third analog circuits are configured to produce substantially similar outputs when receiving substantially similar inputs.

6. The apparatus of claim 5, wherein the output of at least one of the first or second comparator circuits changes from a substantially zero value to a non-zero value when at least one of the first, second, or third analog circuit outputs is affected by a transient event.

7. The apparatus of claim 5, wherein (i) the output of the first comparator has a non-zero value and the output of the second comparator has substantially zero value when the first analog circuit output is affected by a transient event, (ii) the output of the first comparator has a substantially zero value and the output of the second comparator has a non-zero value when the second analog circuit output is affected by a transient event, (iii) the outputs of the first and second comparators have a non-zero value when the third analog circuit output is affected by a transient event, and (iv) the outputs of the first and second comparators have a substantially zero value when none of the first, second or third analog circuit outputs are affected by a transient event.

8. The apparatus of claim 5 wherein the first comparator comprises a first transistor pair and a second transistor pair, wherein the first transistor pair includes a first transistor connected in parallel with a second transistor, wherein the second transistor pair includes a third transistor connected in parallel with a fourth transistor, wherein a first load is connected between the first and second transistor pairs, and wherein the gates of the first, second, third, and fourth transistors are the first comparator's first, second, third, and fourth inputs, respectively.

9. The apparatus of claim 5 wherein the second comparator comprises a third transistor pair and a fourth transistor pair, wherein the third transistor pair includes a fifth transistor connected in parallel with a sixth transistor, wherein the fourth transistor pair includes a seventh transistor connected in parallel with an eighth transistor, wherein a second load is connected between the third and fourth transistor pairs, and wherein the gates of the fifth, sixth, seventh, and eighth transistors are the second comparator's first, second, third, and fourth inputs, respectively.

10. A method comprising:
receiving a first analog signal at (i) a first input of a first comparator and (ii) a second and third input of a second comparator;
receiving a second analog signal at (i) a second and third input of the first comparator and (ii) a first input of the second comparator;
receiving a third analog signal at (i) a fourth input of the first comparator and (ii) a fourth input of the second comparator;
generating a first comparator output that is proportional to the sum of the first comparator's third and fourth inputs subtracted from the sum of the first comparator's first and second inputs when the first comparator's second input is substantially equal to the first comparator's third input; and
generating a second comparator output that is proportional to the sum of the second comparator's third and fourth inputs subtracted from the sum of the second comparator's first and second inputs when the second comparator's second input is substantially equal to the second comparator's third input.

11. The method of claim 10, further comprising:
determining whether at least one of the first, second, or third analog signals has been affected by a transient event, wherein said determining is based on the values of the first and second comparator outputs.

12. The method of claim 11, wherein said determining comprises:
   determining that the first analog signal has been affected by a transient event when the output of the first comparator has a non-zero value and the output of the second comparator has substantially zero value;
   determining that the second analog signal has been affected by a transient event when the output of the first comparator has a substantially zero value and the output of the second comparator has a non-zero value;
   determining that the third analog signal has been affected by a transient event when the outputs of the first and second comparators have a non--zero value; and
   determining that none of the first, second, or third analog signals has been affected by a transient event when the outputs of the first and second comparators have a substantially zero value.

13. The method of claim 11, further comprising:
   selecting one of the first, second, or third analog signals determined to not have been affected by a transient event.

* * * * *

UNITED STATES PATENT AND TRADEMARK OFFICE
CERTIFICATE OF CORRECTION

PATENT NO. : 7,579,879 B2  Page 1 of 1
APPLICATION NO. : 11/262081
DATED : August 25, 2009
INVENTOR(S) : Erstad et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 407 days.

Signed and Sealed this

Fourteenth Day of September, 2010

David J. Kappos
*Director of the United States Patent and Trademark Office*